March 28, 1967 R. E. IRONS 3,311,758
TRANSISTORIZED BROADBAND SWITCH
Filed Nov. 12, 1964
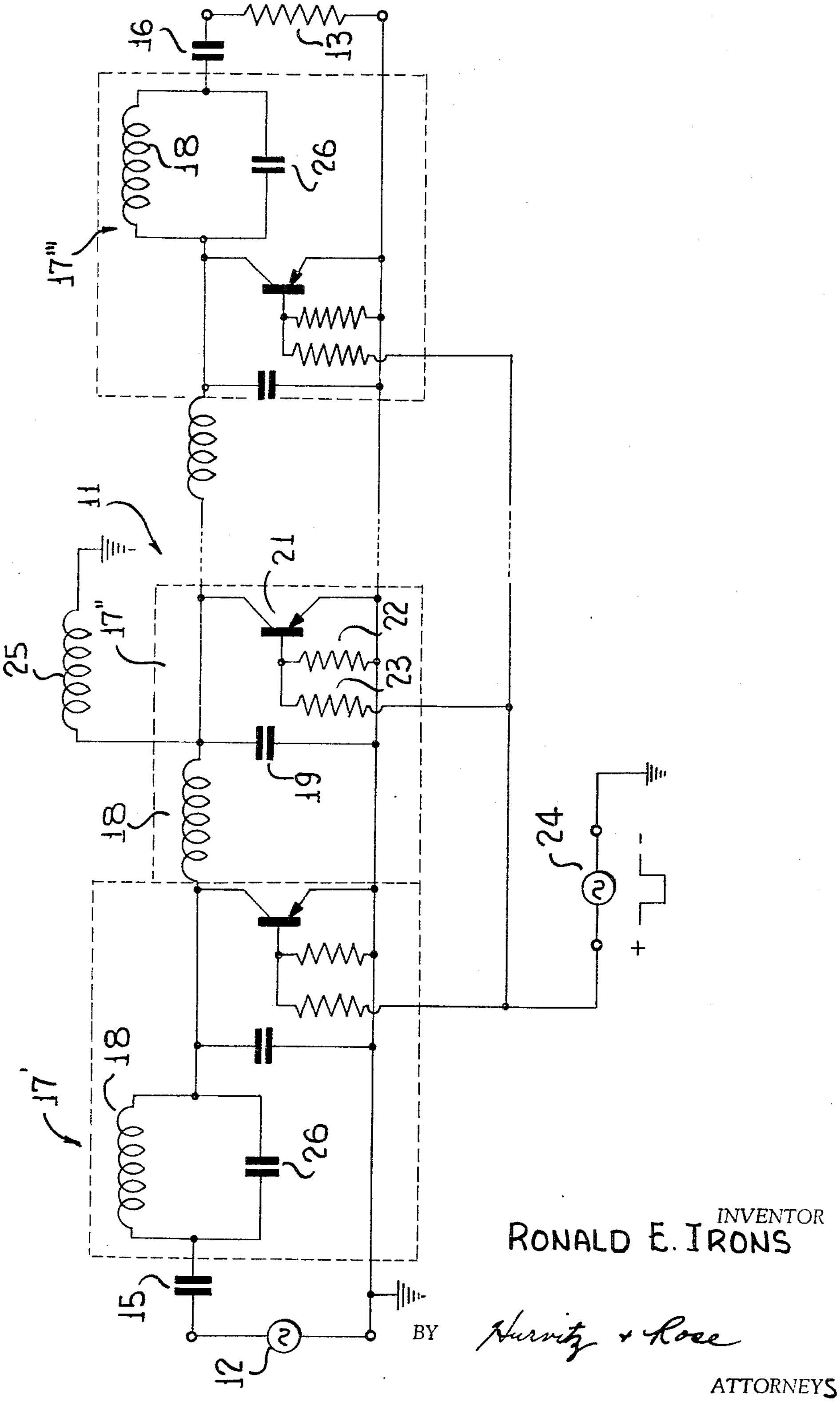
INVENTOR
RONALD E. IRONS
BY Hurvitz + Rose
ATTORNEYS United States Patent Office 3,311,758
Patented Mar. 28, 1967

3,311,758

TRANSISTORIZED BROADBAND SWITCH

Ronald E. Irons, Burke, Va., assignor to Melpar, Inc., Falls Church, Va., a corporation of Delaware Filed Nov. 12, 1964, Ser. No. 410,406
6 Claims. (Cl. 307—88.5)

The present invention relates generally to electronic switches and, more particularly, to a switch including a transistor shunting a filter section adapted to pass a signal spectrum without attenuation, which transistor requires no D.C. emitter collector energizing supply.

For electronic applications, in switching a source to a load it is usually desired that the switching device have no more than one db insertion loss in one state and at least 80 db loss in the other state. One typical prior art approach to the problem involves cascading a number of filter stages together, across each of which is connected a switching diode. In one state of the diodes, the filter stages are designed to pass, without substantial attenuation, the input signal spectrum to the load. Alternatively, the diodes are switched to saturation by a single common source of relatively large amplitude. Since the switching source saturates every diode, it feeds a relatively large current into the filter, causing considerable voltage transients during switching. These transients are coupled through the switch to the load and source, sometimes resulting in their failure or erroneous activation of the load. Another disadvantage attendant with diode switches is their relatively large saturation resistance, on the order of 5 ohms. Because of the relatively large resistance, a large number of sections must be employed to obtain the required attenuation.

According to the present invention, the disadvantages of the diode switch are obviated by replacing the diode switches with the emitter collector path of transistors that are selectively activated into a one ohm saturation state in response to application of a switching signal to their base electrode. The transistors do not require an external emitter collector source, hence the problem of large transients flowing in the filter inductances at the time of switching is obviated. The transient problem is further reduced since the control current supplied to the base electrode is decoupled from the filter circuit inductances and capacitors. Also, since transistors require less current than diodes to reach saturation and there are few dissipating elements between the source and control electrode, the power and voltage requirements of the source are considerably less than in the prior art circuit.

While I am aware of a prior art transistor switch in combination with a band pass filter section being disclosed in U.S. Patent No. 2,992,338 to Winters, it is noted that this reference discloses a D.C. power supply across the transistor emitter collector path. This supply introduces many of the same problems regarding transients into the network as occurred with the described diode switch and that are avoided with the present invention.

It is, accordingly, an object of the present invention to provide a new and improved electronic switch.

Another object of the invention is to provide an electronic switch having low insertion losses because it is a filter having a pass band within the spectrum of signals to be passed, yet does not introduce significant transients during switching.

A further object of the invention is to provide a new and improved low insertion electronic switch in which a relatively low power control source is required.

Another object of the present invention is to provide a multisection low pass electronic switch wherein the number of sections is minimized because each has a shunt impedance capable of being driven to approximately one ohm.

The above and still further objects, features and advantages of the present invention will become apparent upon consideration of the following detailed description of one specific embodiment thereof, especially when taken in conjunction with the accompanying drawing, wherein:

The single figure is a circuit diagram of a preferred embodiment of the invention.

Referring now to the single figure of the drawing, there is provided a multistage switch 11 for selectively coupling signal between fixed bandwidth source 12 and load 13, shown as a resistor for exemplary purposes. Because source 12, in a typical embodiment, is an R.F. signal having a frequency range between 10 mc. and 100 mc., coupling of switch 11 between it and load 13 is achieved through series capacitors 15 and 16, respectively.

Connected between coupling capacitors 15 and 16 is a plurality of cascaded switching networks 17, three of which are shown for purposes of illustration. The number of networks 17 required is determined by the degree which load 13 must be decoupled from source 12. A typical section 17″ includes a low pass filter section comprising series inductance 18 and shunt capacitor 19. Each of sections 17 is of relatively high Q (on the order of 10), with a peak response at a different frequency within the spectrum of source 12. The cut off frequency of each section is considerably beyond the highest frequency of source 12. Connected in parallel with capacitor 19 is the emitter collector path of PNP transistor 21.

The base emitter junction of transistor 21 is connected via a resistive voltage divider comprising resistors 22 and 23 to two state control source 24. In its first state, source 24 supplies sufficient positive voltage to the emitter-base junction to maintain transistor 21 cut off. When source 24 is in the opposite state, it forward biases the emitter base junction sufficiently to cause the transistor collector current to become saturated, whereby its emitter collector impedance is approximately one ohm, a virtually short circuit condition. The rise and fall times of source 24 in going between its two states must be sufficiently fast to prevent introduction of transients in load 13 when transistor 21 is switched, i.e. the frequencies introduced into the network by source 24 during switching must be sufficiently high to be attenuated by the low pass filter sections.

Common to the emitter collector paths of the transistor in each section 17 is a single choke coil 25. Coil 25 provides a return path for the D.C. currents in transistors 21 when they are activated into saturation, yet is substantially an infinite shunt impedance, i.e. open circuit, for the frequencies of source 12 so that it does not attenuate signal.

Each of sections 17 is identical to described section 17″, except first section 17′ and last section 17‴. These sections both differ from section 17″ by inclusion of a trimmer capacitor 26 across inductance 18. Capacitors 26 are adjusted so that the insertion loss of switch 11 between source 12 and load 13, when transistor switches 21 are open circuited, is less than one db over the entire frequency range of source 12. This low loss is achieved, basically, by designing the cut-off frequency of each low pass filter section to be considerably in excess of the highest frequency in the spectrum of source 12.

In operation, initially assume that each of transistors 21 is activated to cut-off by source 24. Signal is thus transmitted, substantially unattenuated, between source 12 and load 13. The inductance of coil 25 is sufficient to prevent shunt loading for all frequencies of source 12. The values of inductances 18 in first and last sections 17' and 17''' are adjusted to compensate for the low frequency attenuation effects of capacitors 15 and 16.

When transistors 21 are all switched to their low impedance state, the currents flowing through inductors 18 and voltages across capacitors 19 are dissipated through the resulting very low impedance transistor emitter collector paths. Typically, the one ohm saturation impedance of transistor 19 in any section 17 is typically on the order of one-tenth the impedance of inductor 18 in that section for the lowest frequency of source 21. The impedance ratio between inductance 18 and saturated transistor 21 is limited by the maximum inductance which in turn is set by standard filter design constraints and by the minimum practical transistor saturation resistance. Because the impedance ratio, hence voltage diversion ratio, of each section 17 is thus necessarily limited, more than one switching section is usually needed to decouple load 13 from source 12. The number of sections 17 required depends upon the degree of decoupling desired.

When saturated, transistors 21 shunt the line with about a one ohm resistance regardless of the amplitude and polarity of source 12. It is noted that no external D.C. source across the emitter collector path is provided as the transistor is switched into saturation solely by source 24. Because no D.C. supply is connected across transistors 21, inductors 18 are not subjected to heavy transient currents as the transistors are switched on. Of course, heavy transients are to be avoided at the moment of transistor switching to prevent excessive energy from being coupled to load 13.

In steady state saturation of transistors 21, i.e. when source 24 is of constant negative voltage, negative D.C. current flows from the base of each transistor to its emitter as well as to its collector. D.C. current flowing through the collector of every transistor 21 is returned to the grounded side of source 24 through the low, D.C. impedance path of choke coil 25. The D.C. collector saturation currents are decoupled from load 13 and source 12, by capacitors 15 and 16, respectively; a desirable feature for operating the source and load at quiescent points independent of the state of switch 11.

When the emitter collector paths of transistors 21 are again switched off by source 24 going to a positive voltage, switch 11 enables the voltage of source 12 to be passed to load 13 substantially without attenuation, in the manner previously described.

While I have described and illustrated one specific embodiment of my invention, it will be clear that variations of the details of construction which are specifically illustrated and described may be resorted to without departing from the true spirit and scope of the invention as defined in the appended claims.

What I claim is:

1. A switch for selectively passing a signal source having a predetermined frequency range to a load comprising a plurality of cascaded switching sections connected between said source and load, each of said sections including a filter section for passing signals in said range without substantial attenuation, a transistor switch having its emitter collector path shunting said section, and driven solely by the signal energy of said source, a control source coupled to the emitter base junction of said transistor for selectively open and short circuiting the transistor emitter collector path.

2. A switch for selectively passing to a load a signal source having a wide frequency range from almost D.C. to a predetermined frequency comprising a plurality of switch sections, cascaded between said source and load, each of said switch sections including a low pass filter section having a cut-off frequency in excess of said predetermined frequency to pass all frequencies within said range substantially without attenuation, a transistor switch having its emitter collector path shunting said section and driven only by the signal source, a control source coupled between the emitter base junction of said transistor for selectively open and short circuiting the emitter collector path, and a D.C. path shunting the emitter collector path of said transistor to ground, said D.C. path being substantially an open circuit to the lowest frequency within range.

3. A switch for selectively passing to a load a signal source having a wide frequency range from almost D.C. to a predetermined frequency comprising a plurality of switch sections cascaded between said source and load, each of said switch sections including; a relatively high Q low pass filter section having a cut-off frequency in excess of said predetermined frequency to pass all frequencies within said range substantially without attenuation, a transistor switch having its emitter collector path shunting said section and driven only by the signal source, a control source coupled between the emitter base junction of said transistor for selectively open and short circuiting the emitter collector path; separate capacitors for only A.C. coupling said source to the first one of said sections and said load to the last one of said sections, and an inductance providing a D.C. return path for the emitter collector paths of the transistors in said sections, said inductance being substantially an open circuit to the lowest frequency in said range.

4. A switch for selectively passing to a load a signal source having a wide frequency range comprising an inductance in series circuit between said load and said source, a capacitor in shunt with said load and said source and connected to said source via said inductance, said capacitor and inductance being a filter passing frequencies in said range between said source and said load substantially without attenuation, a transistor having its emitter collector path connected in shunt with said capacitor and driven solely by said signal source, a D.C. path shunting the emitter collector path of said transistor, said D.C. path being substantially an open circuit to frequencies within said range, and a control source coupled to the base of said transistor for selectively open and short circuiting said emitter collector path.

5. A switch for selectively passing to a load a signal source having a wide frequency range comprising a tapped inductance in series circuit between said load and said source, a capacitor in shunt with said load and said source and connected to said source via the tap on said inductance, said capacitor and inductance being a filter passing frequencies in said range between said source and said load substantially without attenuation, a transistor having its emitter collector path connected in shunt with said capacitor and driven solely by said signal source, a D.C. path shunting the emitter collector path of said transistor, said D.C. path being substantially an open circuit to frequencies within said range, and a control source coupled to the base of said transistor for selectively open and short circuiting said emitter collector path.

6. A switch for selectively passing to a load a signal source having a wide frequency range comprising an inductance in series circuit between said load and said source, a capacitor in shunt with said load and said source and connected to said source via said inductance, said capacitor and inductance being a filter passing frequencies in said range between said source and said load substantially without attenuation, a separate capacitance connecting one end of said inductance to said source and the other end of said inductance to said load, a transistor having its emitter collector path connected in shunt with said capacitor and driven solely by said signal source, a choke coil providing a D.C. path shunting the emitter collector path of said transistor, said D.C. path being substantially an open circuit to frequencies within said range, and a control source coupled to the base of said transistor for selectively open and short circuiting said emitter collector path.

No references cited.

ARTHUR GAUSS, *Primary Examiner*.

D. D. FORRER, *Assistant Examiner*.